(12) United States Patent
Kimura

(10) Patent No.: US 8,426,972 B2
(45) Date of Patent: Apr. 23, 2013

(54) SEMICONDUCTOR DEVICE AND METHOD FOR MANUFACTURING THE SAME

(75) Inventor: Keisuke Kimura, Nagoya (JP)

(73) Assignee: Toyota Jidosha Kabushiki Kaisha, Toyota-Shi (JP)

(*) Notice: Subject to any disclaimer, the term of this patent is extended or adjusted under 35 U.S.C. 154(b) by 0 days.

(21) Appl. No.: 13/345,165

(22) Filed: Jan. 6, 2012

(65) Prior Publication Data

US 2012/0104612 A1    May 3, 2012

Related U.S. Application Data

(63) Continuation of application No. PCT/JP2009/062448, filed on Jul. 8, 2009.

(51) Int. Cl.
*H01L 23/48* (2006.01)
*H01L 23/52* (2006.01)
*H01L 21/44* (2006.01)

(52) U.S. Cl.
USPC ............... 257/765; 257/771; 257/E21.021; 438/573; 438/613

(58) Field of Classification Search .......... 257/765, 257/771, E21.021; 438/573, 613
See application file for complete search history.

(56) References Cited

U.S. PATENT DOCUMENTS

| | | | | |
|---|---|---|---|---|
| 4,908,685 A | * | 3/1990 | Shibasaki et al. | 257/425 |
| 4,987,562 A | * | 1/1991 | Watanabe | 257/742 |
| 5,430,329 A | * | 7/1995 | Harada et al. | 257/786 |
| 5,946,597 A | * | 8/1999 | Miura et al. | 438/662 |
| 6,187,680 B1 | * | 2/2001 | Costrini et al. | 438/688 |
| 6,191,485 B1 | * | 2/2001 | Kawashima et al. | 257/766 |
| 6,613,663 B2 | * | 9/2003 | Furuya | 438/613 |
| 6,660,625 B2 | * | 12/2003 | Lee et al. | 438/613 |
| 6,703,707 B1 | | 3/2004 | Mamitsu et al. | |
| 7,045,388 B2 | * | 5/2006 | Tatsumi et al. | 438/108 |
| 7,350,686 B2 | * | 4/2008 | Onozaki et al. | 228/256 |

(Continued)

FOREIGN PATENT DOCUMENTS

JP    05-047764 A    2/1993
JP    01-318236 A    12/1998

(Continued)

OTHER PUBLICATIONS

Translation of International Preliminary Report on Patentability mailed Feb. 23, 2012 of PCT/JP2009/062448.

(Continued)

*Primary Examiner* — Jarrett Stark
*Assistant Examiner* — Nicholas Tobergte
(74) *Attorney, Agent, or Firm* — Kenyon & Kenyon LLP

(57) ABSTRACT

A semiconductor device has: a semiconductor substrate; and an upper surface electrode laminated on an upper surface of the semiconductor substrate, wherein at least one portion of the upper surface electrode includes a first layer formed on an upper surface side of the semiconductor substrate, a second layer formed on an upper surface side of the first layer, a third layer in contact with the upper surface of the second layer, and a fourth layer formed on an upper surface side of the third layer. The first layer is a barrier metal layer. The second layer is an Al (aluminum) layer. The third layer is one of an Al—Si (aluminum-silicon alloy) layer, an Al—Cu (aluminum-copper alloy) layer and an Al—Si—Cu (aluminum-silicon-copper alloy) layer. The fourth layer is a solder joint layer.

2 Claims, 7 Drawing Sheets

U.S. PATENT DOCUMENTS

| | | |
|---|---|---|
| 2003/0132530 A1 | 7/2003 | Teshima et al. |
| 2004/0089925 A1 | 5/2004 | Fukuda et al. |
| 2004/0089941 A1 | 5/2004 | Mamitsu et al. |
| 2004/0097082 A1 | 5/2004 | Mamitsu et al. |

FOREIGN PATENT DOCUMENTS

| | | |
|---|---|---|
| JP | 2000-252313 A | 9/2000 |
| JP | 2001-284525 A | 10/2001 |
| JP | 2004-263267 A | 9/2004 |
| JP | 2005-314738 A | 11/2005 |
| JP | 2007-019412 A | 1/2007 |

OTHER PUBLICATIONS

Translation of International Search Report mailed Sep. 29, 2009 of PCT/JP2009/062448.

* cited by examiner

SEMICONDUCTOR DEVICE AND METHOD FOR MANUFACTURING THE SAME

CROSS-REFERENCE TO RELATED APPLICATION

This application is a continuation of PCT application PCT/JP2009/062448 filed on Jul. 8, 2009 designating the United States of America, the entire contents of which are incorporated by reference herein.

TECHNICAL FIELD

The present teachings relate to a semiconductor device having an upper surface electrode with a solder joint layer, and to a method for manufacturing the same.

DESCRIPTION OF RELATED ART

A semiconductor device, or a power device, is usually soldered to a heatsink and heat generated by the semiconductor device is released through the heatsink. The semiconductor device has a lower surface electrode formed on a lower surface side of the semiconductor device and an upper surface electrode formed on an upper surface side of the same. The lower surface electrode and the upper surface electrode are soldered to heatsinks. The heat generated by the semiconductor device can be released from the heatsinks joined to the upper surface side and the lower surface side of the semiconductor device.

The upper surface electrode soldered to the heatsink has an aluminum (Al) metal layer that comes into ohmic contact with a semiconductor substrate, and a solder joint layer such as a nickel (Ni) layer formed on the upper surface of the Al metal layer. When forming the Ni layer and the like on the upper surface of the Al metal layer, a zinc (Zn) substitution treatment is performed to form a Zn substituted film on the Al metal layer and thereby the Ni layer and the like are formed by nonelectrolytic plating, as described in Japanese Patent Application Publication No. 2000-252313, for example. The Zn substitution treatment is performed by soaking the Al metal layer in Zn substitution treatment liquid, which is a strong alkaline solution containing Zn ions.

SUMMARY

In the semiconductor device that has the solder joint layer on the upper surface electrode, an increase in diameter of a wafer and decrease in thickness of the same can easily leads to warpage of the wafer or formation of cracks on the solder joint layer such as the Ni layer. The warpage of the wafer and the formation of cracks on the solder joint layer make the operations of subsequent production processes difficult, which eventually creates problems in the electrical characteristics of the produced semiconductor device.

Forming the solder joint layer into a film of favorable flatness is effective in preventing the warpage of the wafer and the formation of cracks on the solder joint layer. Forming an Al electrode into a film of favorable flatness and providing the Zn substituted film with excellent adhesion and elaborateness, are effective in forming the solder joint plate into a film of favorable flatness.

The inventor of the present invention has examined the Al electrode layer that is appropriate for forming the solder joint layer into a film of favorable flatness. As a result, the inventor has discovered that it is difficult to accomplish both ohmic contact between a semiconductor substrate and an upper surface electrode and formation of a favorably flat solder joint layer.

The present application was contrived in view of the circumstances described above, and an object thereof is to accomplish both ohmic contact between a semiconductor substrate and an upper surface electrode and formation of a favorably flat solder joint layer.

A semiconductor device of the present teachings has: a semiconductor substrate; and an upper surface electrode laminated on an upper surface of the semiconductor substrate, wherein: at least one portion of the upper surface electrode includes a first layer formed on an upper surface side of the semiconductor substrate, a second layer formed on an upper surface side of the first layer, a third layer in contact with the upper surface of the second layer, and a fourth layer formed on an upper surface side of the third layer. The first layer is a barrier metal layer. The second layer is an Al (aluminum) layer. The third layer is an Al—Si (aluminum-silicon alloy) layer, an Al—Cu (aluminum-copper alloy) layer or an Al—Si—Cu (aluminum-silicon-copper alloy) layer. The fourth layer is a solder joint layer.

Here, "a first layer formed on an upper surface side of the semiconductor substrate" described above also means that the first layer is formed in contact with the upper surface of the semiconductor substrate. Therefore, the first layer may be formed in contact with the upper surface of the semiconductor substrate, or another layer may be formed between the semiconductor substrate and the first layer. Note that "a second layer formed on an upper surface side of the first layer" and "a fourth layer formed on an upper surface side of the third layer" are the same in meaning as the first layer described above.

In this semiconductor device, the first layer, which is a barrier metal layer, is formed on the upper surface side of the semiconductor device, and the second layer, which is an Al layer, is formed on the upper surface side of the barrier metal layer. Accordingly, ohmic contact is secured between the semiconductor substrate and upper surface electrode. The third layer, which is an Al—Si layer, an Al—Cu layer, or an Al—Si—Cu layer, is formed on the upper surface of the Al layer. When the Zn substitution treatment is performed on the upper surface of the third layer, a Zn substituted film with better adhesion and elaborateness can be formed, compared to when the Zn substitution treatment is performed on the upper surface of the Al layer that contains almost no silicon or copper. Therefore, the fourth layer, which is the solder joint layer, can be provided with favorable flatness.

The Al layer, which can be easily made flatter than the third layer, which is the Al—Si layer, the Al—Cu layer or the Al—Si—Cu layer, can be formed, as the second layer, in a position closer to the upper surface of the semiconductor substrate. Therefore, the upper surface of the third layer can be provided with favorable flatness. As a result, the fourth layer, which is the solder joint layer, can be formed into a film of favorable flatness.

This semiconductor device described above can accomplish both ohmic contact between the semiconductor substrate and the upper surface electrode and formation of a favorably flat solder joint layer. In the prior art, in order from a Zn substituted film as a film with excellent adhesion and elaborateness, a method for adding ferric chloride or other additive to Zn substitution treatment liquid or a method for etching an upper surface of an Al metal layer prior to the Zn substitution treatment needs to be performed. Depending on manufacturing conditions, neither of these methods is necessary in this semiconductor device, contributing to simplification of the production processes and cost reduction.

The present teachings can also provide a method for manufacturing a semiconductor device that has a semiconductor substrate and an upper surface electrode laminated on an upper surface of the semiconductor substrate. This manufacturing method includes: forming a first layer on the upper surface of the semiconductor substrate by a barrier metal; forming a second layer on an upper surface of the first layer by aluminum after forming a first layer; forming a third layer on an upper surface of the second layer by Al—Si, Al—Cu or Al—Si—Cu after forming a second layer; performing zinc substitution treatment on an upper surface of the third layer after forming a third layer; and forming a fourth layer, which is a solder joint layer, on the upper surface of the third layer by nonelectrolytic plating after forming a first layer.

DETAILED DESCRIPTION OF EMBODIMENT

[Embodiment 1]

Figure 1:
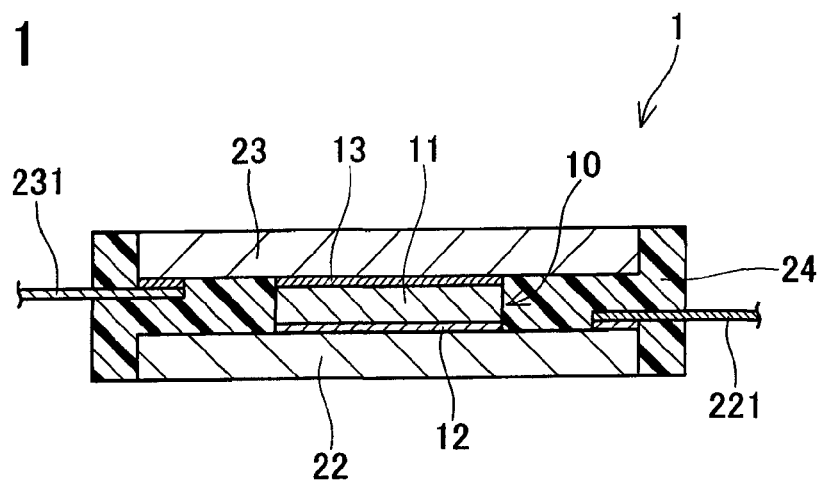
FIG. 1 shows a semiconductor module having a semiconductor device of Embodiment 1.

Embodiments of the present teachings are described hereinafter with reference to the drawings. A semiconductor device 10 according to a present embodiment is installed in a semiconductor module 1, as shown in FIG. 1. The semiconductor module 1 is covered with a mold material 24 and has a metal plate 22 and metal plate 23 exposed on its lower surface side and upper surface side respectively. A lead 221 is connected to the metal plate 22, and a lead 231 is connected to the metal plate 23.

The semiconductor device 10 has a semiconductor substrate 11, lower surface electrode 12 and upper surface electrode 13. The upper surface electrode 13 is soldered to the upper surface metal plate 23. The lower surface electrode 12 is soldered to the lower surface metal plate 22. In this manner, the semiconductor device 10 is fixed between the two metal plates 22, 23. Because the semiconductor device 10 is joined to the two metal plates 22, 23 exposed to the outside of the semiconductor module 1, heat generated by the semiconductor device 10 can be released easily from the metal plates 22, 23.

Figure 2:
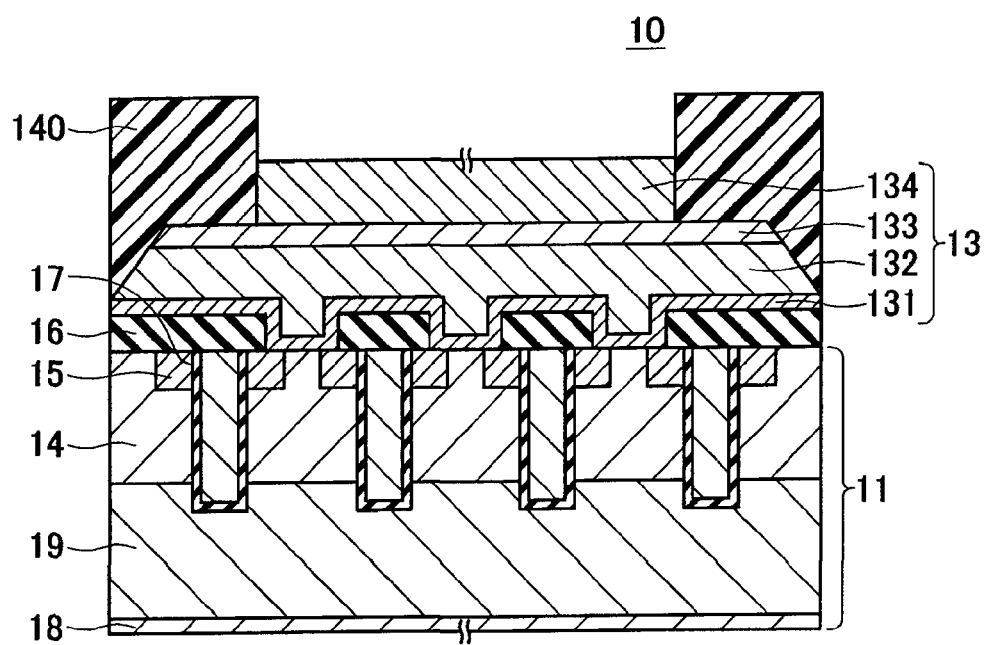
FIG. 2 schematically shows a cross section of a part in the vicinity of an upper surface electrode of the semiconductor device of Embodiment 1.

FIG. 2 schematically shows a cross section of a part in the vicinity of the upper surface electrode 13 of the semiconductor device 10. The semiconductor device 10 is embedded in the semiconductor module 1 by applying solder on an upper surface of the upper surface electrode 13 and joining the upper surface electrode 13 to the metal plate 23. FIG. 2 omits a configuration repeated in a lateral direction of the semiconductor device 10 and shows only a part thereof.

As shown in FIG. 2, a vertical trench gate IGBT that can be used as a power device is incorporated in the semiconductor substrate 11. A first conductivity-type collector region 18, second conductivity-type drift region 19 and first conductivity-type body region 14 are laminated in this order on the lower surface side of the semiconductor substrate 11. A second conductivity-type emitter region 15 is formed on an upper surface of the body region 14. Trench gates 17 penetrate through the body region 14 from the upper surface of the semiconductor substrate 11 is provided. The trench gates 17 are in contact with the emitter region 15. Each of the trench gates 17 has a gate electrode that is covered with a gate insulator film. An upper surface of the gate electrode is covered with interlayer dielectric films 16 formed in part of the upper surface of the semiconductor substrate 11.

A titanium nitride (TiN) layer 131 is formed in contact with the upper surfaces of the semiconductor substrate 11 and the interlayer dielectric films 16. An Al layer 132, Al—Si layer 133 and Ni layer 134 are formed on an upper surface of the titanium nitride layer 131. A polyimide layer 140 is formed on part of upper surfaces of the Al layer 132 and the Al—Si layer 133 as a protective film and is in contact with a side surface of the Ni layer 134.

The TiN layer 131, an example of the first layer serving as a bather metal layer, is in contact with the upper surface of the semiconductor substrate 11 (the side on which the emitter region 15 is formed). Not only titanium nitride (TiN) but also titanium silicon (TiSi) can be favorably used as the first layer.

The Al layer 132, an example of the second layer containing aluminum (Al) as a primary component, is in contact with the upper surface of the TiN layer 131. When using the Al layer as the second layer, the mass concentration of impurities is preferably 0.1 wt % or lower. The second layer is preferably formed to have a thickness of approximately 3 to 4 µm to be able to absorb the level difference of the interlayer dielectric films 16 and the like.

The Al—Si layer 133, an example of the third layer, is in contact with the upper surface of the Al layer 132. When using the Al—Si layer as the third layer, the mass concentration of Si is preferably equal to or greater than 0.1 wt % but equal to or lower than 2 wt %. The third layer preferably has a thickness of 1 µm or more.

Not only the Al—Si layer but also, an Al—Cu layer and Al—Si—Cu layer may alternatively be used as the third layer. When using the Al—Cu layer as the third layer, the mass concentration of Cu is preferably equal to or greater than 0.3 wt % but equal to or lower than 2 wt %. When using the Al—Si—Cu layer as the third layer, the mass concentration of Si is preferably equal to or greater than 0.1 wt % and equal to or lower than 2 wt %, and the mess concentration of Cu is preferably equal to or greater than 0.3 wt % and equal to or lower than 2 wt %.

The Ni layer 134, an example of the fourth layer serving as a solder joint layer, is in contact with the upper surface of the Al—Si layer 133 in the present embodiment. The fourth layer is a solder joint layer that is formed after the upper surface of the third layer is subjected to a zinc substitution treatment. As described hereinafter, the Ni layer 134 according to the present embodiment is also formed after the upper surface of the Al—Si layer 133 is subjected to the zinc substitution treatment. A material capable of forming a eutectic with solder can be used in the fourth layer, and not only Ni used in the present embodiment but also Cu and the like can be favorably used. The fourth layer preferably has a thickness of approximately 3 to 10 µm.

An antioxidant layer for preventing the solder joint layer from oxidizing may be formed on the upper surface of the fourth layer. A material that can prevent the upper surface of the fourth layer from oxidizing and secure wettability to the solder. Materials such as gold (Au) and silver (Ag) can be favorably used as the antioxidant layer.

Figure 3:
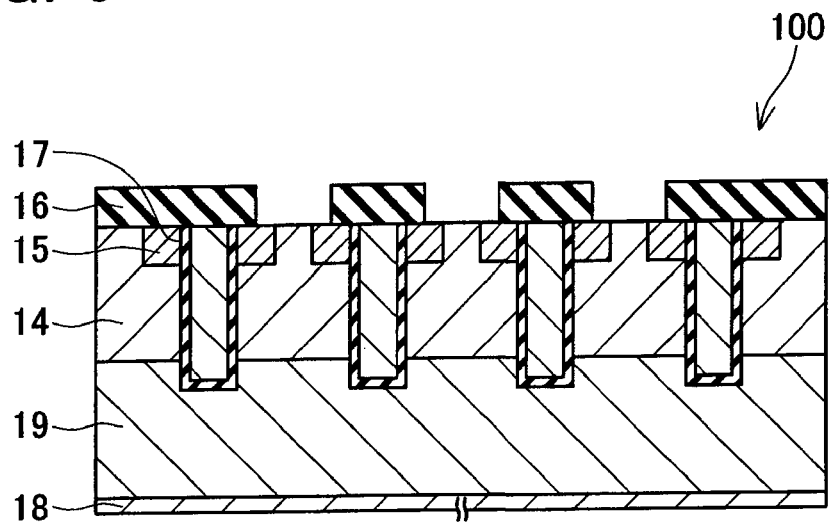
FIG. 3 is a diagram for explaining a method for manufacturing the semiconductor device of Embodiment 1.

A method for manufacturing an upper surface electrode of the present embodiment is described next. As shown in FIG. 3, a silicon wafer 100 is prepared in which the interlayer dielectric films 16 are formed on the upper surface of the semiconductor substrate 11 having the IGBT formed therein. An upper surface electrode is manufactured by forming the first layer, the second layer, the third layer and the fourth layer on the upper surface side of the wafer 100.

(First Step)

Figure 9:
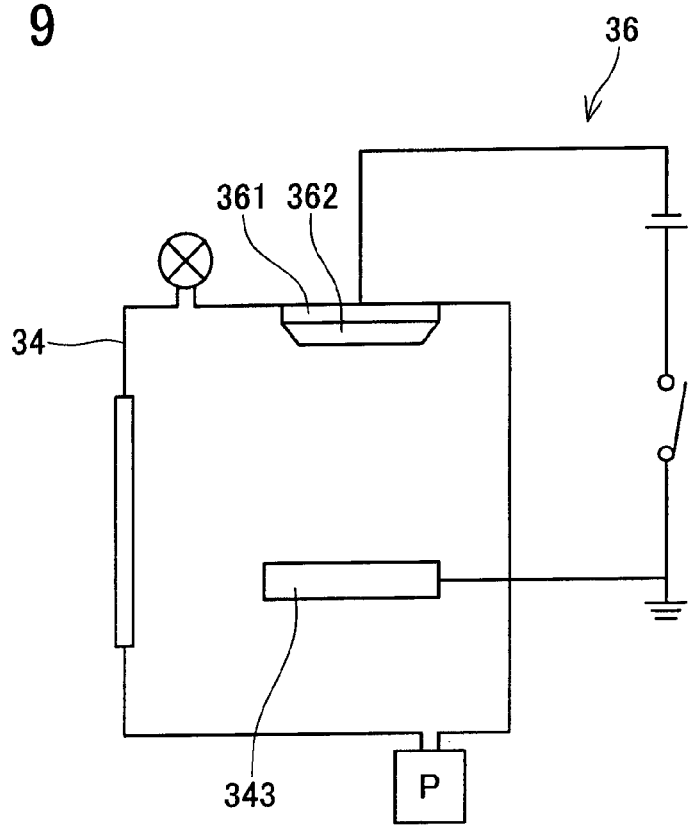
FIG. 9 is a conceptual diagram of a sputtering device used in the method for manufacturing the semiconductor device of Embodiment 1.

First, the TiN layer 131 serving as the first layer is formed on the upper surface of the wafer 100 by a sputtering method. FIG. 9 is a diagram schematically showing a sputtering device 36 used for forming the TiN layer 131, the Al layer 132 and the Al—Si layer 133 according to the present embodiment. The sputtering device 36 has a bucking plate 361, target 362 and stage 343 in a chamber 34. The sputtering device 36 is configured to be capable of applying high voltage between the target 362 and the wafer placed on the stage 343. The target 362 and the stage 343 are disposed apart from each other to face each other in the chamber 34. A temperature sensor is installed in the stage 343 to detect the temperature (substrate temperature) of the wafer 100 placed on the stage 343.

Figure 4:
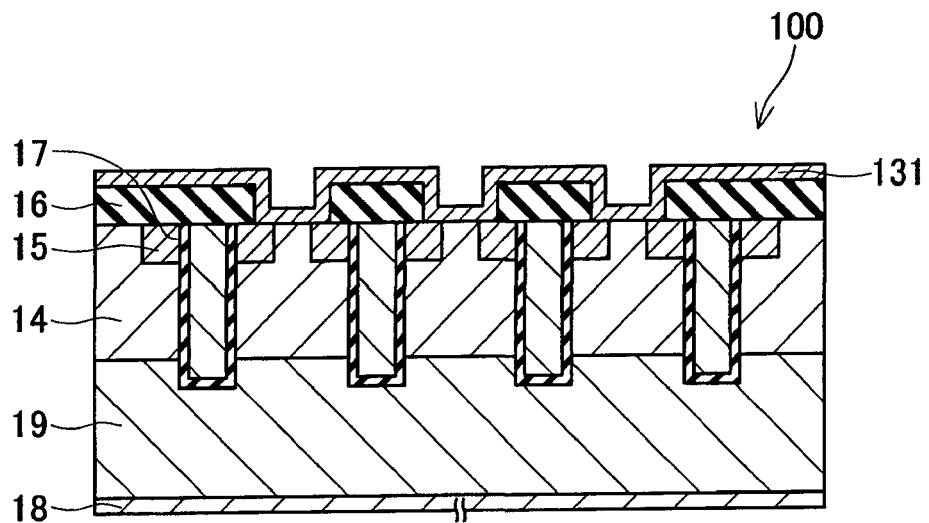
FIG. 4 is a diagram for explaining the method for manufacturing the semiconductor device of Embodiment 1.

The wafer 100 is placed on the stage 343, and TiN is used as the material of the target 362. Sputtering is performed thereon to form the TiN layer 131 on an upper surface of the wafer 100. The wafer 100 is placed on the stage 343 such that its upper surface side having the interlayer dielectric films 16 configures the target 362. The pressure inside the chamber 34 is reduced, and the substrate temperature is controlled to a predetermined temperature based on a value detected by the temperature sensor installed in the stage 343. The substrate temperature is preferably set within a range of a room temperature (25° C.) to 300° C. After reducing the pressure, Ar gas is introduced into the chamber 34, and high voltage is applied between the target 362 and the wafer 100 placed on the stage 343. In this manner, the TiN layer 131 can be formed on the upper surface of the wafer 100, as shown in FIG. 4.

(Second Step)

Figure 5:
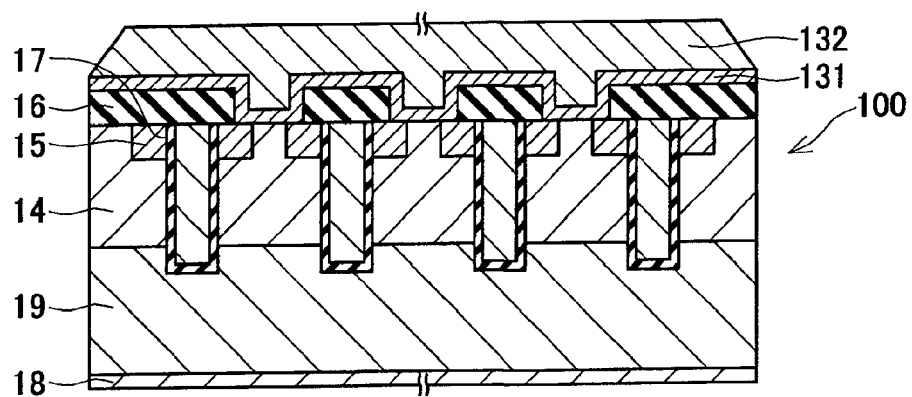
FIG. 5 is a diagram for explaining the method for manufacturing the semiconductor device of Embodiment 1.

Subsequently, the Al layer 132 serving as the second layer is formed on the upper surface of the wafer 100 by the sputtering method. More specifically, sputtering is performed by using high-purity Al as the material of the target 362 and controlling the substrate temperature to a predetermined temperature based on the value detected by the temperature sensor installed in the stage 343. The substrate temperature is preferably set within the range of a room temperature (25° C.) to 300° C. In this manner, the Al layer 132 can be formed on the upper surface of the TiN layer 131, as shown in FIG. 5.

The Al layer 132 is thick enough to cover the level difference of the interlayer dielectric films 16, and the upper surface of the Al layer 132 has favorable flatness.

(Third Step)

Figure 6:
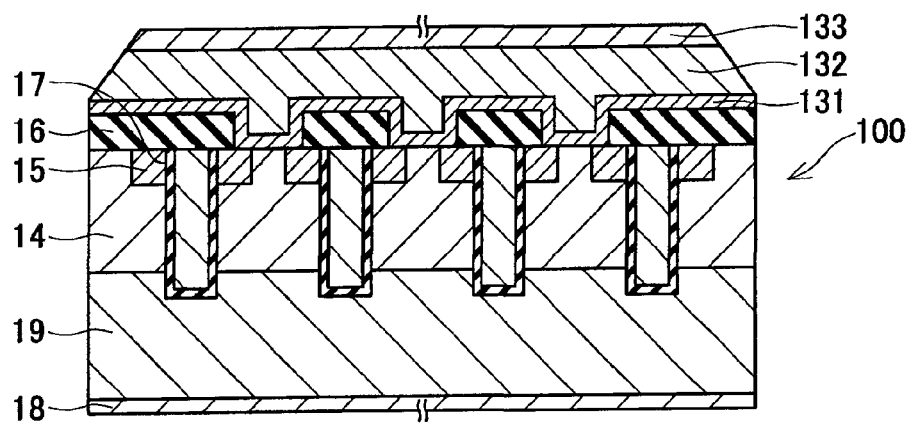
FIG. 6 is a diagram for explaining the method for manufacturing the semiconductor device of Embodiment 1.

Next, the Al—Si layer 133 serving as the third layer is formed by the sputtering method. More specifically, sputtering is performed by using an Al—Si alloy as the material of the target 362 and controlling the substrate temperature to a predetermined temperature based on the value detected by the temperature sensor installed in the stage 343. The substrate temperature is preferably set within the range of a room temperature (25° C.) to 300° C. In this manner, the Al—Si layer 133 can be formed on the upper surface of the Al layer 132, as shown in FIG. 6. Because the upper surface of the Al layer 132 has favorable flatness, the upper surface of the Al—Si layer 133 can also have favorable flatness. Because the Al—Si layer 133 is formed on the flat upper surface of the Al layer 132, even sputtering the Al—Si layer 133 at low temperature can secure flatness of the upper surface of the Al—Si layer 133. The occurrence of Si nodules can be prevented by sputtering the Al—Si layer 133 at low temperature. As a result, ohmic contact between surface electrode 13 and the semiconductor substrate 11 can be secured.

The same method as those described above can be used when forming the Al—Cu layer or the Al—Si—Cu layer as the third layer. The Al—Cu layer or the Al—Si—Cu layer can be formed as the third layer by using a sputtering method in the same manner described above, with an Al—Cu alloy or Al—Si—Cu alloy as the material of the target 362.

Figure 7:
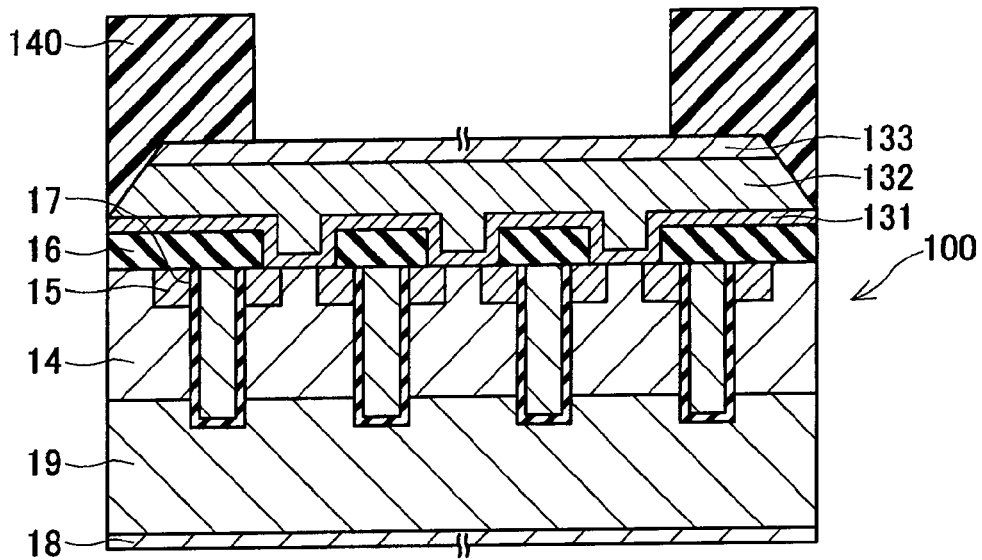
FIG. 7 is a diagram for explaining the method for manufacturing the semiconductor device of Embodiment 1.

Subsequently, the chamber 34 is removed from the wafer 100, to form the polyimide layer 140 as a protective layer, as shown in FIG. 7. The polyimide layer 140 can be formed by, for example, applying polyamide acid to the wafer 100 and thereafter polymerizing the polyamide acid by an annealing treatment.

(Fourth Step)

The zinc (Zn) substitution treatment is performed on the upper surface of the Al—Si layer 133 serving as the third layer. In the Zn substitution treatment, zinc oxide (ZnO) is dissolved into 100 g/L in a 500 g/L sodium hydroxide (NaOH) solution, to prepare a zincate treatment liquid. This zincate treatment liquid has zincate ions $ZnO_2^{2-}$ therein. A double zincate treatment is performed using this zincate treatment liquid.

In the double zincate treatment, first, the upper surface side of the Al—Si layer 133 formed in the third step is soaked in the zincate treatment liquid. As a result, the upper surface side of the Al—Si layer 133 dissolves, and Zn particles precipitate on the Al—Si layer 133, thereby forming a first Zn substituted film.

Next, the first Zn substituted film is peeled off using a nitric acid solution. Peeling the first Zn substituted film that is formed first, can improve the adhesion and elaborateness of the Zn substituted film.

After peeling the first Zn substituted film, the upper surface side of the Al—Si layer 133 is soaked in the zincate treatment liquid again, to form a second Zn substituted film. The Zn substitution treatment is finished.

Figure 10:
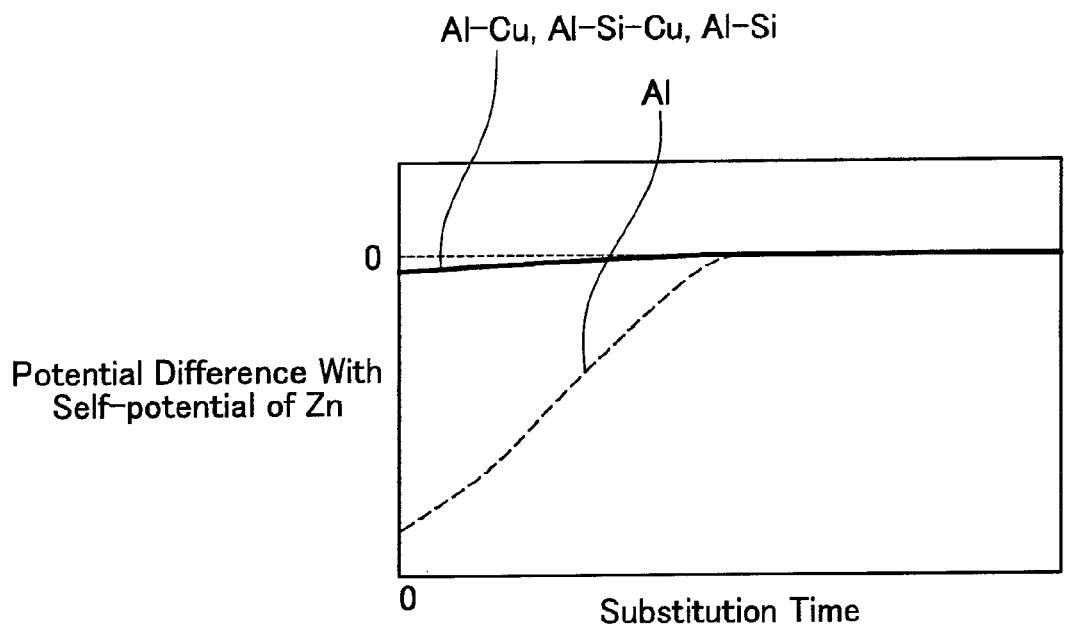
FIG. 10 is a diagram for explaining temporal changes in potential of Al metal in a Zn substitution treatment.

FIG. 10 is a diagram for explaining temporal changes in potential of Al metal that are obtained when performing the Zn substitution treatment on the Al metal. The vertical axis shows the potentials of the Al metal subjected to the Zn substitution treatment, based on the potential difference with self-potential of Zn. The horizontal axis shows substitution time at which the Zn substitution treatment is performed. FIG. 10 shows temporal changes that are obtained when the Al metal, subjected to the Zn substitution treatment, is the material of the second layer, and temporal changes that are obtained when Al—Si, Al—Cu, or Al—Si—Cu is the material of the third layer. The potential difference between the Al metal and the Zn obtained when the substitution time is zero indicates the potential difference between the self-potential of the Al metal and the self-potential of the Zn. When the time taken in the Zn substitution treatment elapses and the potential of the Al metal becomes equal to the self-potential of the Zn, the Zn substituted film is formed on the Al metal.

As is clear from FIG. 10, the difference between the self-potential of the Al and the self-potential of the Zn is great. For this reason, in the steps of the Zn substitution treatment, it takes a long time for the potential of the Al to become equal to the self-potential of the Zn. In other words, when the Zn substitution treatment is performed on the Al, it takes a long time for the Zn substituted film to be formed. In this case, the Zn substituted film to be formed has poor adhesion and elaborateness.

On the other hand, the difference between self-potential of Al—Si, Al—Cu or Al—Si—Cu and the self-potential of the Zn is lower than the difference between the self-potential Al and the self-potential Zn. For this reason, in the steps of the Zn substitution treatment, it takes less time for the potential of the Al—Si, Al—Cu or Al—Si—Cu to become equal to the self-potential of the Zn, as shown in FIG. 10. In other words, when the Zn substitution treatment is performed on the Al—Si, Al—Cu or Al—Si—Cu, it takes less time for the Zn substituted film to be fanned. Therefore, the Zn substituted film to be formed has better adhesion and elaborateness, compared to when the treatment is performed on the Al. Because the Zn substitution treatment is performed on the upper surface of the Al—Si layer 133 serving as the third layer in the present embodiment, a Zn substituted film with excellent adhesion and elaborateness can be formed. Even when forming the Al—Cu layer or Al—Si—Cu layer as the third layer, a Zn substituted film with excellent adhesion and elaborateness can be formed similarly.

(Fifth Step)

Figure 8:
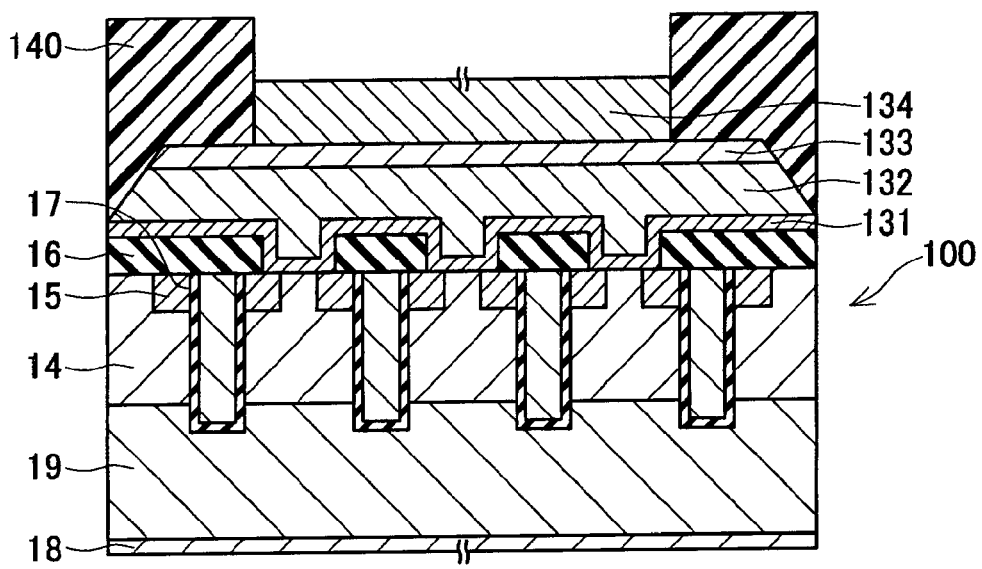
FIG. 8 is a diagram for explaining the method for manufacturing the semiconductor device of Embodiment 1.

As the fourth layer, the Ni layer 134 is formed on the upper surface of the Al—Si layer 133 having the Zn substituted film, by nonelectrolytic plating, as shown in FIG. 8. Nonelectrolytically plating the Ni layer 134 can be performed by, for example, nickel-phosphorus alloy (Ni—P) plating using sodium hypophosphite as a reducing agent.

When forming the antioxidant layer on the upper surface of the fourth layer, the antioxidant layer is formed on the upper surface of the wafer 100 shown in FIG. 8. For example, when forming a Au layer as the antioxidant layer, the Au layer can be formed by a method such as nonelectrolytic plating.

The upper surface electrode 13 of the semiconductor device 10 shown in FIG. 2 can be manufactured by the methods described above. After applying the solder layer to the upper surface electrode 13 of the semiconductor device 10, a solder reflow step is performed on the semiconductor device 10. As a result, the semiconductor device 10 is joined to the metal plate 23 on the upper surface side of the semiconductor module 1. The thermal treatment that is carried out in the solder reflow step often forms an alloy layer of the Ni layer 134 and solder layer. Tin (Sn), silver (Ag) or lead (Pb) can be favorably used as the solder layer.

As described above, in the manufacturing method according to the present embodiment, the Al layer of better flatness than the Al—Si layer, the Al—Cu layer or the Al—Si—Cu layer is used as the second layer and formed on the upper surface of the first layer, which is the bather metal layer. Therefore, the flatness of the upper surface of the second layer becomes favorable. Because the flatness of the upper surface of the second layer is improved, the flatness of the upper surface of the third layer (i.e., the Al—Si layer, the Al—Cu layer or the Al—Si—Cu layer) from the upper surface of the second layer also becomes favorable. Accordingly, the fourth layer, which is the solder joint layer formed on the upper surface of the third layer, can be formed into a film of favorable flatness.

In addition, by forming the Al—Si layer, the Al—Cu layer or the Al—Si—Cu layer as the third layer in the present embodiment, the Zn substituted film with excellent adhesion and elaborateness can be formed in the Zn substitution treatment that is performed subsequently to the formation of the third layer. Therefore, the fourth layer serving as the solder joint layer can be formed into a film of favorable flatness.

As described above, the present embodiment can accomplish both ohmic contact between the semiconductor substrate and the upper surface electrode and formation of a favorably flat solder joint layer. In the prior art, in order to form a Zn substituted film as a film with excellent adhesion and elaborateness, a method for adding ferric chloride or other additive to Zn substitution treatment liquid or a method for etching an upper surface of an Al metal layer prior to the Zn substitution treatment needs to be performed. Depending on manufacturing conditions, neither of these methods is necessary in the semiconductor device of the present embodiment, contributing to simplification of the production processes and cost reduction.

Figure 11:
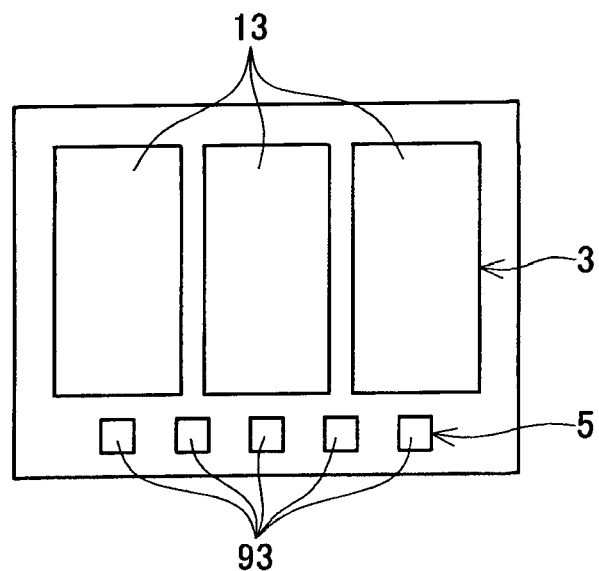
FIG. 11 is a plan view of an upper surface electrode of a semiconductor device of a modification.
Figure 12:
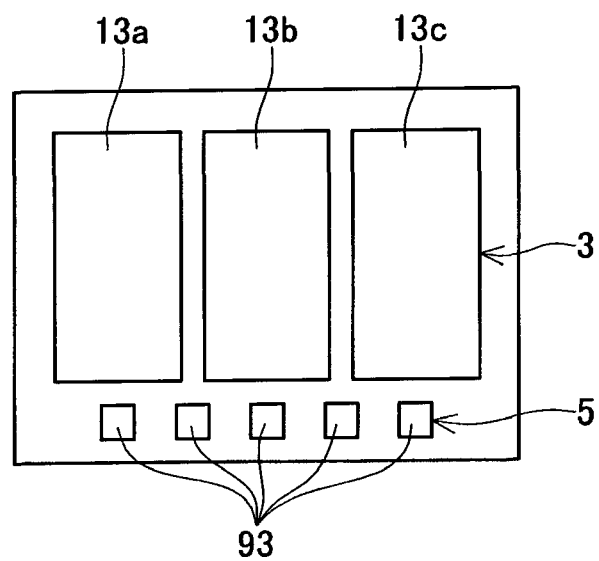
FIG. 12 is a plan view of the upper surface electrode of the semiconductor device of the modification.

Note that, in the present embodiment, the upper surface electrode of the present embodiment is formed on the entire surface of the semiconductor device, but the upper surface electrode of the present embodiment may be formed in a part of the semiconductor device. When forming the upper surface electrode of the present embodiment in a part of the semiconductor device, it is preferred that the upper surface electrode be formed in a section in which a relatively high amount of heat is generated. With the upper surface electrode of the present embodiment being formed at such a section, because the upper surface electrode of the present embodiment has the favorably flat solder joint layer, forming the upper surface electrode in such section is effective in preventing the warpage of the wafer or the formation of cracks on the solder joint layer. For instance, as shown in FIG. 11, in the semiconductor device, the upper surface electrode 13 of the present embodiment may be used only in an upper surface electrode of a main cell 3 that generates heat easily and in which a large current flows, and a conventional upper surface electrode 93 may be used as an upper surface electrode of a sense cell 5 that generates less heat. Moreover, when using the upper surface electrode of the present embodiment only in the upper surface electrode of the main cell 3, upper surface electrodes 13a, 13b, 13c in which the third layers are made of different materials may be used, as shown in FIG. 12. For example, in the upper surface electrode 13a, the third layer is the Al—Cu layer. In the upper surface electrode 13b, the third layer is the Al—Si—Cu layer. In the upper surface electrode 13c, the third layer is the Al—Si layer.

Figure 13:
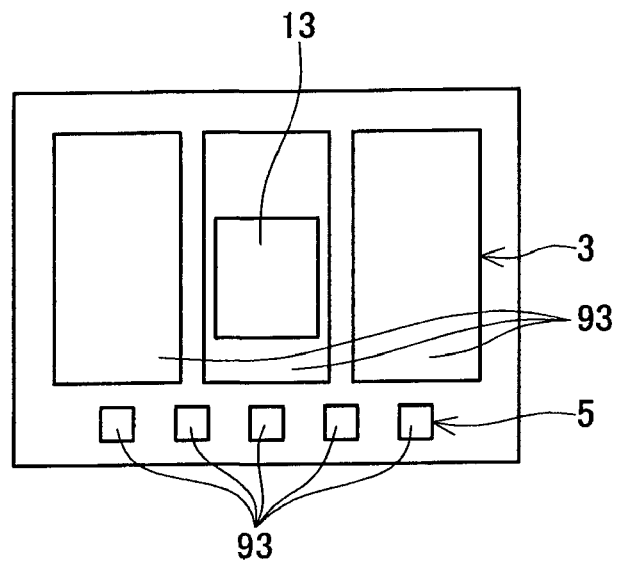
FIG. 13 is a plan view of the upper surface electrode of the semiconductor device of the modification.
Figure 14:
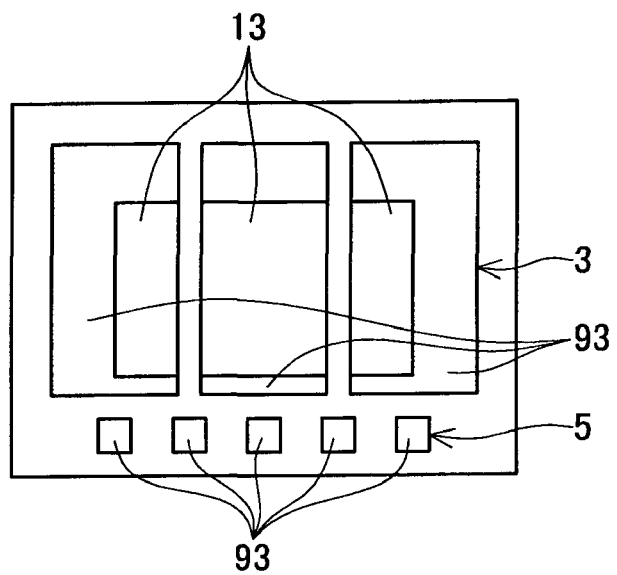
FIG. 14 is a plan view of the upper surface electrode of the semiconductor device of the modification.

When using the upper surface electrode of the present embodiment only in a part of the upper surface electrode of the main cell 3, it is preferred that the upper surface electrode 13 of the present embodiment be formed in a central part of a semiconductor device that easily increase its temperature by generating more heat, as shown in FIGS. 13 and 14.

The above has described the embodiment of the present invention in detail. However, the embodiment of the present invention is merely an example and is not to limit the scope of the patent claims. The technologies described in the scope of the patent claims include various modifications and changes made on the specific examples illustrated above.

The technical elements described in the present specification and the drawings can exhibit technical usefulness, either alone or in combination, and are not limited to the combinations described in the claims as filed. The technologies illustrated in the present specification and the drawings can achieve a plurality of purposes at the same time, and achieving only one of them exerts the technical usefulness.

What is claimed is:

1. A semiconductor device comprising:
    a semiconductor substrate; and
    an upper surface electrode laminated on an upper surface of the semiconductor substrate, wherein
    at least one portion of the upper surface electrode includes a first layer formed on an upper surface side of the semiconductor substrate, a second layer formed on an upper surface side of the first layer, a third layer in contact with the upper surface of the second layer, and a fourth layer formed on an upper surface side of the third layer,
    the first layer is a barrier metal layer;
    the second layer is an Al layer;
    the third layer is one of an Al—Si layer, an Al—Cu layer and an Al—Si—Cu layer; and
    the fourth layer is a solder joint layer.

2. A method for manufacturing a semiconductor device comprising a semiconductor substrate and an upper surface electrode laminated on an upper surface of the semiconductor substrate,
    the method comprising:
    forming a first layer by a barrier metal on the upper surface of the semiconductor substrate;
    forming a second layer by an aluminum on an upper surface of the first layer after forming a first layer;
    forming a third layer by one of an Al—Si, an Al—Cu and an Al—Si—Cu on an upper surface of the second layer after forming the second layer;
    performing zinc substitution treatment on an upper surface of the third layer after forming the third layer; and
    forming a fourth layer, which is a solder joint layer, on the upper surface of the third layer by nonelectrolytic plating after performing zinc substitution treatment.

* * * * *